United States Patent
Qin et al.

(10) Patent No.: US 10,037,964 B1
(45) Date of Patent: Jul. 31, 2018

(54) DIE-PACKAGING COMPONENT WITH RETAINING STRUCTURE FOR PACKAGE BODY THEREOF

(71) Applicant: TAIWAN SEMICONDUCTOR CO., LTD., New Taipei (TW)

(72) Inventors: Reyn Qin, New Taipei (TW); Lucy Fan, New Taipei (TW); Meifang Song, New Taipei (TW); Xiaoli Wang, New Taipei (TW)

(73) Assignee: TAIWAN SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 15/644,232

(22) Filed: Jul. 7, 2017

(30) Foreign Application Priority Data

May 9, 2017 (TW) .............................. 106206587 U

(51) Int. Cl.
*H01L 23/00* (2006.01)
*H01L 23/498* (2006.01)
*H01R 4/02* (2006.01)

(52) U.S. Cl.
CPC ........ *H01L 24/40* (2013.01); *H01L 23/49811* (2013.01); *H01L 23/49838* (2013.01); *H01R 4/028* (2013.01); *H01R 4/029* (2013.01); *H01L 2224/4001* (2013.01); *H01L 2224/4007* (2013.01); *H01L 2224/40221* (2013.01)

(58) Field of Classification Search
CPC . H01L 2924/01079; H01L 2924/01078; H01L 2924/01029; H01L 2224/48091; H01L 2224/48247
See application file for complete search history.

(56) References Cited

U.S. PATENT DOCUMENTS

| 6,897,550 | B1* | 5/2005 | Zwenger | H01L 21/565 257/666 |
| 7,443,012 | B2* | 10/2008 | Yamaguchi | H01L 21/56 257/667 |
| 7,679,173 | B2* | 3/2010 | Uno | H01L 23/49524 257/177 |
| 9,006,871 | B2* | 4/2015 | Fujisawa | H01L 23/3107 257/663 |
| 2007/0176266 | A1* | 8/2007 | Kawano | H01L 23/49524 257/622 |
| 2014/0327121 | A1* | 11/2014 | Yamaguchi | H01L 24/32 257/666 |

* cited by examiner

*Primary Examiner* — Quoc Hoang
(74) *Attorney, Agent, or Firm* — Muncy, Geissler, Olds & Lowe, P.C.

(57) ABSTRACT

A die-packaging component includes a substrate, a die, a jumper structure, a lead structure and a package body. The substrate has a base surface further including a die-connecting portion and a package-body retaining structure surrounding the die-connecting portion. The die connects the die-connecting portion. The jumper structure welded to the die generates a thermal deformation while in conducting a high-voltage current. The lead structure includes a lead groove defining a thermal-deformation tolerance allowable route. While in meeting the thermal deformation, the jumper structure welded to the lead groove as well is movable along the thermal-deformation tolerance allowable route. The package body at least partly covers the lead structure and the substrate, completely covers the die and the jumper structure, and is constrained by the package-body retaining structure.

9 Claims, 5 Drawing Sheets

DIE-PACKAGING COMPONENT WITH RETAINING STRUCTURE FOR PACKAGE BODY THEREOF

BACKGROUND OF THE INVENTION

1. Field of the Invention

The invention relates to a die-packaging component, and more particularly to the die-packaging component with a retaining structure for a package body thereof that applies the package-body retaining structure to retain firmly the package body on a substrate.

2. Description of the Prior Art

Since the industrial revolution, developments in technology have been booming. In particular, communication vehicles for people have been progressed in power from animals to gasoline, nature gas and electricity. In a modern vehicle, when an engine thereof is cranked, an electric system of the vehicle would meet a source change from a battery to a generator. While in a transient stage, circuits of the vehicle would experience an instant load drop, and thus an instant voltage of the related circuit would face an overshoot, which will generate an excessive current to jeopardize electronic components of the circuit. Thus, in order to prevent theses electronic components from potential damages, a circuit-protected component is usually introduced to avoid such damages upon the electronic components. Thereupon, the influence of the excessive current upon the electronic components caused by the instant voltage overshoot can be reduced.

Referring now to FIG. 1, a schematic view of a conventional circuit-protected component is shown. This circuit-protected component PA1 includes a substrate PA11, a die PA12, a lead PA13 and a package body PA14. The substrate PA11 includes a base surface PA111 having a die-mounting portion PA1111 and a package-body locating notch groove PA1112. The package-body locating notch groove PA1112 located at a rim of the base surface PA111 includes an oblique sidewall PA11121.

The die PA12 welded on the die-mounting portion PA1111 via a solder PAW1 is a transient-voltage-suppression (TVS) diode chip. The lead PA13 includes a die-connecting portion PA131 having a bump structure PA1311, and a lead portion PA132. The bump structure PA1311 is welded onto the die PA12 via a solder PAW2. The package body PA14 covering the substrate PA11, at least one lead PA13 and the die PA12 is structurally retained particularly by the oblique sidewall PA11121 of the package-body locating notch groove PA1112. As noted in the figure, the lead portion PA132 is exposed out of the package body PA14.

In this circuit-protected component PA1, as a voltage upon the circuit is escalated abruptly to a high voltage from a low voltage, a current would be instantly led to the die PA12, due that resistance of the die PA12 would drop suddenly while in meeting a high-voltage current. As a consequence, a temperature of the lead PA13, usually having low thermal capacity, would be risen severely. Hence, the lead PA13 and the package body PA14 would be expanded thermally, and thereby would induce thermal stressing to the die PA12, in a parallel direction PAP and/or a perpendicular direction PAV. It is noted that the oblique sidewall PA11121 can help to reduce the thermally stressing upon the package body PA14 only in the parallel direction PAP.

Practically, the die PA12 is vulnerable to be damaged by the thermal stressing in the parallel direction PAP and/or the perpendicular direction PAV. In addition, for temperatures of the solders PAW1, PAW2 are usually risen abruptly to a degree able to melt and thus liquefy the solders PAW1, PAW2, the cooled-down circuit-protected component PA1 would be quite possible to be damaged by the circuit shorting between the substrate PAH and the lead PA13.

SUMMARY OF THE INVENTION

In view of the prior art, while a high-voltage current flows through the circuit-protected component, the die is apt to be damaged by thermal stressing. In addition, since the temperature of the solder is usually risen abruptly to a degree able to melt and thus liquefy the solder, the cooled-down circuit-protected component PA1 would be quite possible to be damaged by the circuit shorting between the substrate and the lead.

Accordingly, it is an object of the present invention to provide a die-packaging component with a retaining structure for a package body thereof is applied to couple a functional circuit. The die-packaging component includes a substrate, a die, a jumper structure, a lead structure and a package body. The substrate has a base surface further including a die-connecting portion and a package-body retaining structure surrounding the die-connecting portion.

The die connects the die-connecting portion. The jumper structure welded to the die generates a thermal deformation while in conducting a high-voltage current. The lead structure includes a lead groove defining a thermal-deformation tolerance allowable route. While in meeting the thermal deformation, the jumper structure welded to the lead groove as well is movable along the thermal-deformation tolerance allowable route. The package body at least partly covers the lead structure and the substrate, completely covers the die and the jumper structure, and is constrained by the package-body retaining structure.

In one embodiment of the present invention, the base surface is furnished with a solder-collecting groove by closing to the die-connecting portion.

In one embodiment of the present invention, the jumper structure includes a jumper body having a side facing the die to provide a protrusive structure protruding toward the die and to be welded onto the die. In addition, the jumper body further has another side opposing to the die to provide at least one jumper-interfering groove for constraining the package body.

In one embodiment of the present invention, the at least one jumper-interfering groove is arranged in a crisscross pattern on the jumper body. Preferably, the jumper-interfering groove is a V-shape groove.

In one embodiment of the present invention, the jumper structure includes a jumper body and a jumper arm. The jumper body connects the die. The jumper arm extended from the jumper body includes a jumper-bent portion. While the jumper structure is stressed, the jumper-bent portion allows the jumper arm to displace along the thermal-deformation tolerance allowable route in an extendable manner.

In one embodiment of the present invention, the die-packaging component further includes at least one package-body constraining groove constructed by closing to a rim of the base surface and having an oblique constraint wall for limiting the package body.

In one embodiment of the present invention, the package-body retaining structure is a dovetail slot.

As stated above, by providing the die-packaging component with a retaining structure for a package body thereof in accordance with the present invention, since the substrate is furnished with the package-body retaining structure, thus, while the package body is under thermal stressing, the package body would be firmly retained by the package-body retaining structure. In addition, as the jumper structure is stressed, the jumper arm is movable along the thermal-deformation tolerance allowable route of the lead groove. In addition, while the solder between the die and the substrate is heated, the solder would flow into the solder-collecting groove.

In comparison with the prior art, by providing the die-packaging component with a retaining structure for a package body thereof in accordance with the present invention, since the package body is firmly retained by the retaining structure and the jumper arm can move along the thermal-deformation tolerance allowable route of the lead groove while the jumper structure is thermally stressed, thus the package body won't be damaged by the stressing in the parallel and perpendicular directions. In addition, while the solder between the die and the substrate is heated, then the liquefied solder would flow into the solder-collecting groove, such that solder contacting between the die and the jumper structure can be inhibited, and thus possible short circuiting between the die and the jumper structure can be avoided.

All these objects are achieved by the die-packaging component with a retaining structure for a package body thereof described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a die-packaging component with a retaining structure for a package body thereof. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
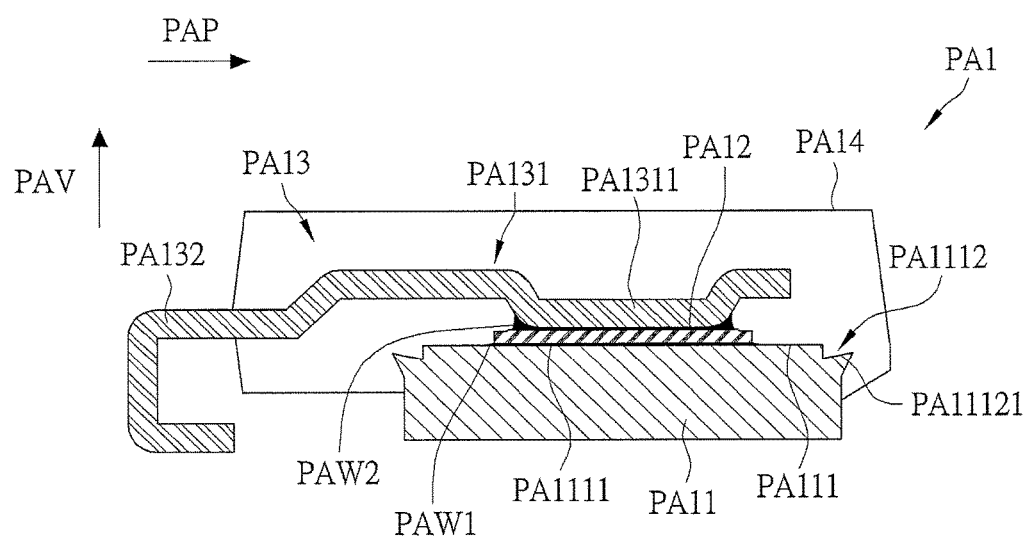
FIG. 1 is a schematic view of a conventional circuit-protected component.
Figure 2:
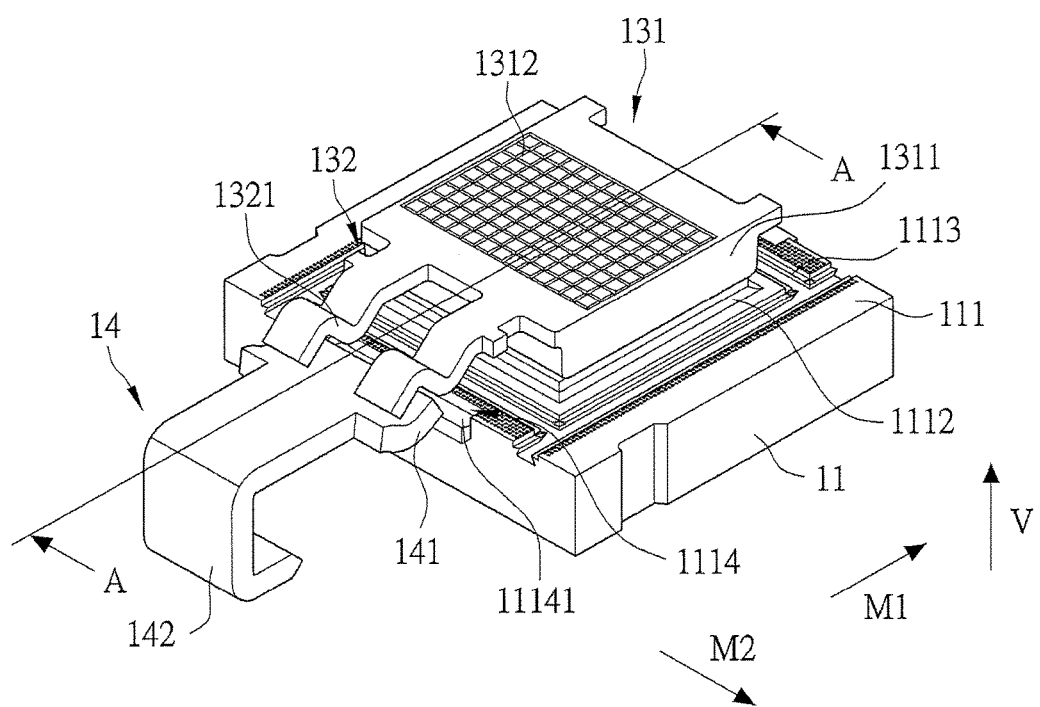
FIG. 2 is a schematically perspective view of a preferred die-packaging component with a retaining structure but without a package body in accordance with the present invention.
Figure 3:
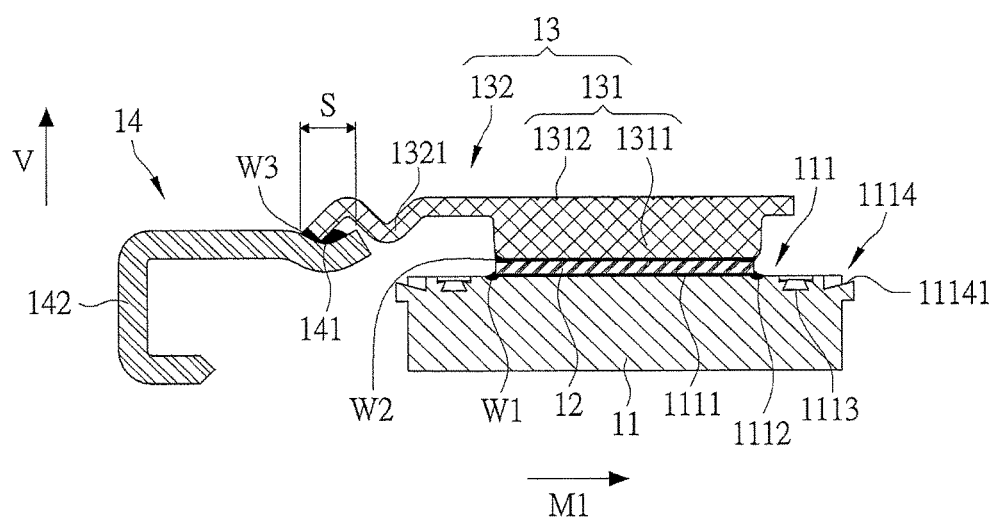
FIG. 3 is a schematically cross-sectional view along line A-A of FIG. 2.
Figure 4:
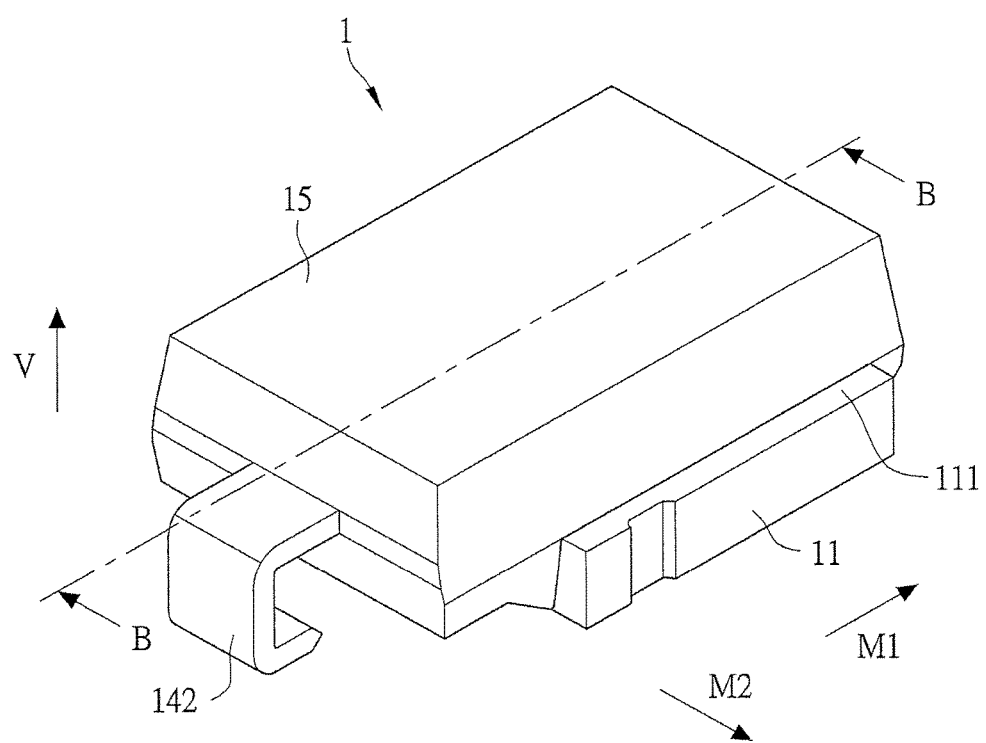
FIG. 4 is a schematically perspective view of the preferred die-packaging component of FIG. 2 with the package body in accordance with the present invention.
Figure 5:
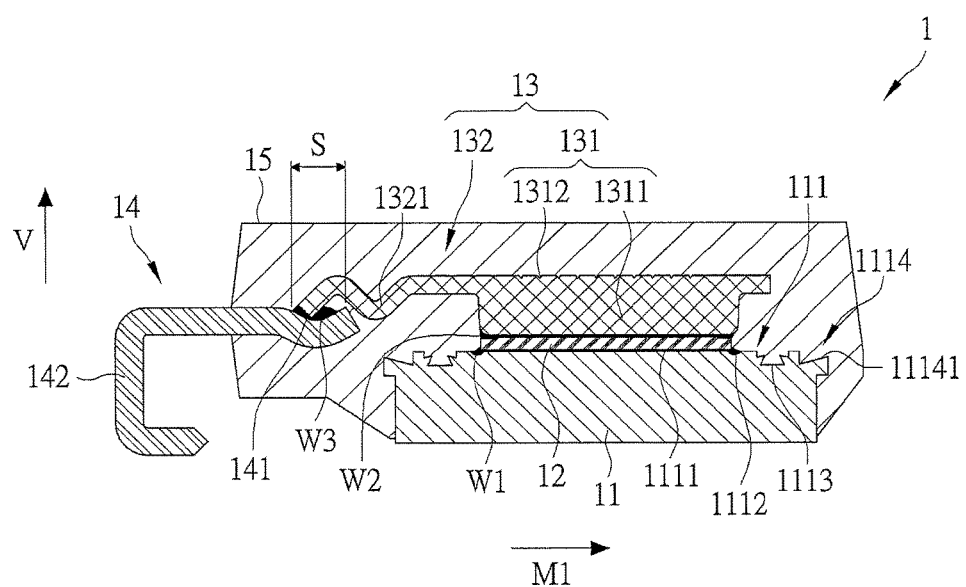
FIG. 5 is a schematically cross-sectional view along line B-B of FIG. 4.

Refer now to FIG. 2 through FIG. 5; where FIG. 2 is a schematically perspective view of a preferred die-packaging component with a retaining structure but without a package body in accordance with the present invention, FIG. 3 is a schematically cross-sectional view along line A-A of FIG. 2, FIG. 4 is a schematically perspective view of the preferred die-packaging component of FIG. 2 with the package body, and FIG. 5 is a schematically cross-sectional view along line B-B of FIG. 4. As shown, in this embodiment, the die-packaging component with a retaining structure for a package body thereof 1 includes a substrate 11, a die 12, a jumper structure 13, a lead structure 14 and a package body 15.

The substrate 11 has a base surface 111 further including a die-connecting portion 1111, a solder-collecting groove 1112, a package-body retaining structure 1113 and two package-body constraining grooves 1114 (one labeled in the figure only), in which the die-connecting portion 1111 is located in a central area of the base surface 111. In this embodiment, the die-connecting portion 1111 is a flat platform. In some other embodiments, the die-connecting portion 1111 can be, but not limited to, a convex platform. The solder-collecting groove 1112 located on the base surface 111 is to surround the die-connecting portion 1111 closely. The solder-collecting groove 1112 is constructed to surround the die-connecting portion 1111 on the base surface 111 by extending continuously in a first parallel direction M1 and a second parallel direction M2 on the base surface 111, where the first parallel direction M1 is perpendicular to the second parallel direction M2.

The package-body retaining structure 1113 for covering the die-connecting portion 1111 is located on the base surface 111 by providing a lower rim thereof to extend in the first parallel direction M1 and the second parallel direction M2, such that the die-connecting portion 1111 can be completely and compactly surrounded thereinside. In this embodiment, the package-body constraining groove 1114 is, but not limited to, a dovetail slot, and is constructed by closing to the rim of the base surface 111. The package-body constraining groove 1114 further has an oblique constraint wall 11141.

The die 12 is welded onto the die-connecting portion 1111 via a solder W1. In this embodiment, the die 12 can be a transient-voltage-suppression (TVS) diode chip. However, in some other embodiments, the die 12 can be, but not limited to, a general diode chip, an LED (Light-emitting diode) chip, a photodiode chip, a Schottky diode chip, a tunnel diode chip, a varactor diode chip or a Zener diode chip.

The jumper structure 13 includes a jumper body 131 and a jumper arm 132. The jumper body 131 has a side facing the die 12 to provide a protrusive structure 1311 protruding toward the die 12 and to be welded onto the die 12 via a solder W2. In this embodiment, the protrusive structure 1311 is, but not limited to, a convex platform.

In addition, the jumper body 131 has another side opposing to the die 12 to provide at least one jumper-interfering groove 1312 arranged in a crisscross pattern thereon. In particular, the at least one jumper-interfering groove 1312 is shaped into a grid pattern formed on the jumper body 131. In this embodiment, the jumper-interfering groove 1312 is, but not limited to, a V-shape groove.

The lead structure 14 includes a lead groove 141 and a lead extension 142. The lead groove 141 is furnished in a way to define a thermal-deformation tolerance allowable route S connecting the jumper arm 132 and being welded to the lead groove 141 via a solder W3. In this embodiment, the lead groove 141 can be (but not limited to) an arc-shape groove, and the thermal-deformation tolerance allowable route S can be (but not limited to) linear or arc-shaped. It shall be mentioned that the lead extension 142 has an end distant to the lead groove 141 and bent toward the substrate 11.

The package body 15 at least partly packages the lead extension 142 and the substrate 11, but includes thereinside the die 12, the jumper structure 13 and the lead groove 141. The package body 15 is retained in positions, or structurally interfered, by the package-body retaining structure 1113, and is restrained by the oblique constraint wall 11141 of the package-body constraining groove 1114. In this embodiment, the package body 15 can be made of, but not limited to, a polyimide siloxane for providing a well insulation property to prevent moisture from contaminating the die 12.

As the die-packaging component with a retaining structure for a package body thereof 1 is conducted by introducing a high-voltage current so as thereby to escalate temperatures of the substrate 11, the jumper structure 13 and the lead structure 14, and thus to generate thermal deformations, then the solder W1 at the die-connecting portion 1111 would be melted and thus liquefied. The liquefied solder W1 would be led to the nearby solder-collecting groove 1112 of the die-connecting portion 1111 so as to prevent the solders W1, W2 from direct contacting, such that possible short circuiting between the substrate 11 and the jumper structure 13 can be avoided.

In addition, as the temperatures of the substrate 11, the jumper structure 13 and the lead structure 14 is risen, thermal expansion would occur at the substrate 11, the jumper structure 13, the lead structure 14 and the package body 15, and induce thermal stressing upon the substrate 11, the jumper structure 13, the lead structure 14 and the package body 15 in the first parallel direction M1, the second parallel direction M2 and a perpendicular direction V perpendicular to the base surface 111.

The expanded package body 15 would be stressed to deform or displace in the first parallel direction M1, the second parallel direction M2 and the perpendicular direction V. However, since the package body 15 is retained by the package-body retaining structure 1113 and limited structurally by the oblique constraint wall 11141 of the package-body constraining groove 1114. Thereupon, relative movement between the package body 15 and the substrate 11 is avoided. In addition, the jumper-interfering groove 1312 can also prevent the package body 15 from possible displacements with respect to the jumper structure 13.

In addition, when the jumper structure 13 is heated to induce thermal stressing, the jumper-bent portion 1321 would stretch in a negative direction of the first parallel direction M1, and allow the jumper arm 132 to displace along the thermal-deformation tolerance allowable route S, such that the stressing upon the die 12 by the jumper structure 13 would be relieved and thus possible thermal damages on the die 12 would be avoided.

In summary, by providing the die-packaging component with a retaining structure for a package body thereof in accordance with the present invention, the solder-collecting groove can collect the melted solder liquefied from the heated solder between the die and the substrate. Further, the package-body retaining structure and the package-body constraining groove can be used to avoid relative movement between the package body and the substrate while the package body is stressed. In addition, the jumper-bent portion would allow the jumper arm to displace along the thermal-deformation tolerance allowable route of the lead groove in an extendable manner, while the jumper structure is stressed.

In comparison with the prior art, since the package body of the present invention is firmly retained by the retaining structure and the package-body constraining groove, thus the die would be free from damages under stressing. Since the liquefied solder between the die and the substrate would flow to the solder-collecting groove, thus the solder between the die and the substrate won't connect the other solder between the die and the jumper structure, so that possible short circuiting between the substrate and the jumper structure would be inhibited. For the jumper arm can move along the thermal-deformation tolerance allowable route of the lead groove while the jumper structure is stressed, then the stressing on the jumper structure can be released, such that potential damages upon the die caused by the thermal stressing can be avoided.

Thereupon, the aforesaid shortcoming in the conventional circuit-protected component that the die thereof would be damaged by the thermal stressing while in conducting the high-voltage current can be resolved. In addition, the conventional problem of the circuit-protected component that the melted solder leads to a possible short circuit between the substrate and the lead after the circuit-protected component is cooled down can be resolved as well.

While the present invention has been particularly shown and described with reference to a preferred embodiment, it will be understood by those skilled in the art that various changes in form and detail may be without departing from the spirit and scope of the present invention.

What is claimed is:

1. A die-packaging component with a retaining structure for a package body thereof, applied to couple a functional circuit, comprising:
    a substrate, having a base surface, the base surface further including a die-connecting portion and a package-body retaining structure to surround the die-connecting portion;
    a die, connecting the die-connecting portion;
    a jumper structure, welded to the die, generating a thermal deformation while in conducting a high-voltage current, and including:
        a jumper body, connecting the die; and
        a jumper arm, extended from the jumper body, including a jumper-bent portion;
    a lead structure, including a lead groove defining a thermal-deformation tolerance allowable route; wherein, while in meeting the thermal deformation, the jumper structure welded to the lead groove as well is movable along the thermal-deformation tolerance allowable route; and
    a package body, at least partly covering the lead structure and the substrate, completely covering the die and the jumper structure, and constrained by the package-body retaining structure;
    wherein while the jumper structure is stressed caused by the thermal deformation, the jumper-bent portion allows the jumper arm to displace along the thermal-deformation tolerance allowable route in an extendable manner.

2. The die-packaging component of claim 1, wherein the package-body retaining structure is a dovetail slot.

3. The die-packaging component of claim 1, wherein the base surface is furnished with a solder-collecting groove by closing to the die-connecting portion.

4. The die-packaging component of claim 3, wherein the solder-collecting groove constructed on the base surface is to surround the die-connecting portion.

5. The die-packaging component of claim 1, wherein the jumper structure includes a jumper body having a side facing the die to provide a protrusive structure protruding toward the die and to be welded onto the die.

6. The die-packaging component of claim 1, wherein the jumper structure includes a jumper body having a side opposing to the die to provide at least one jumper-interfering groove for constraining the package body.

7. The die-packaging component of claim 6, wherein the at least one jumper-interfering groove is arranged in a crisscross pattern on the jumper body.

8. The die-packaging component of claim 6, wherein the at least one jumper-interfering groove is at least one V-shape groove.

9. The die-packaging component of claim 1, further comprising at least one package-body constraining groove constructed by closing to a rim of the base surface and having an oblique constraint wall for limiting the package body.

* * * * *